(12) United States Patent
Arritt et al.

(10) Patent No.: US 10,522,998 B2
(45) Date of Patent: Dec. 31, 2019

(54) METHOD FOR DETECTING AN OPEN-PHASE CONDITION OF A TRANSFORMER

(71) Applicant: The UAB Research Foundation, Birmingham, AL (US)

(72) Inventors: Robert F. Arritt, Knoxville, TN (US); Roger C. Dugan, Knoxville, TN (US); Wayne E. Johnson, Charlotte, NC (US); Gregory A. Franklin, Hayden, AL (US)

(73) Assignee: The UAB Research Foundation, Birmingham, AL (US)

( * ) Notice: Subject to any disclaimer, the term of this patent is extended or adjusted under 35 U.S.C. 154(b) by 0 days.

(21) Appl. No.: 16/111,439

(22) Filed: Aug. 24, 2018

(65) Prior Publication Data
US 2019/0027919 A1    Jan. 24, 2019

Related U.S. Application Data

(63) Continuation of application No. 15/117,987, filed as application No. PCT/US2014/017678 on Feb. 21, 2014, now Pat. No. 10,090,665.

(51) Int. Cl.
*H02H 3/16* (2006.01)
*H02H 3/253* (2006.01)
(Continued)

(52) U.S. Cl.
CPC ........... *H02H 3/165* (2013.01); *G01R 31/024* (2013.01); *G01R 31/027* (2013.01); *G01R 31/06* (2013.01);
(Continued)

(58) Field of Classification Search
CPC ...................................................... H02H 3/165
(Continued)

(56) References Cited

U.S. PATENT DOCUMENTS 3,579,038 A    5/1971    Backderf et al.
3,624,499 A    11/1971    Smith et al.
(Continued)

FOREIGN PATENT DOCUMENTS

CN    101752873 A    6/2010
CN    102906847 A    1/2013
(Continued)

OTHER PUBLICATIONS

International Search Report, PCT/US14/17678 dated Jun. 9, 2014.
(Continued)

*Primary Examiner* — David Luo
(74) *Attorney, Agent, or Firm* — Curatolo Sidoti Co., LPA; Joseph G. Curatolo; Salvatore A. Sidoti

(57) ABSTRACT

A method for detecting an open-phase condition of a transformer having a grounded-wye high voltage side connection including monitoring current flowing in a neutral connection on the high voltage side of the transformer in real time by voltage relaying and current relaying to identify an open phase condition signature in a signal capable of characterizing change of current magnitude. A current signal may be injected onto the neutral terminal and the zero-sequence mode of the transformer monitored to detect an open-phase condition indicated by an increase in network impedance and decrease or elimination of the injection current.

17 Claims, 7 Drawing Sheets

(51) Int. Cl.
  *G01R 31/02* (2006.01)
  *G01R 31/06* (2006.01)
  *H02P 29/024* (2016.01)
  *H02H 3/04* (2006.01)

(52) U.S. Cl.
  CPC .............. *H02H 3/04* (2013.01); *H02H 3/253* (2013.01); *H02P 29/024* (2013.01); *H02P 29/0241* (2016.02); *H02H 3/162* (2013.01)

(58) Field of Classification Search
  USPC ................................ 318/813, 812, 767, 727
  See application file for complete search history.

(56) References Cited

U.S. PATENT DOCUMENTS

| | | | |
|---|---|---|---|
| 3,697,810 A | 10/1972 | Wilson et al. | |
| 3,721,862 A | 3/1973 | Brennen et al. | |
| 3,746,965 A | 7/1973 | Okada et al. | |
| 3,838,314 A | 9/1974 | Boothman et al. | |
| 3,852,641 A | 12/1974 | Titus | |
| 4,110,808 A | 8/1978 | Hobson, Jr. et al. | |
| 4,188,619 A | 2/1980 | Perkins | |
| 4,228,475 A | 10/1980 | Sherwood | |
| 4,481,501 A | 11/1984 | Perkins | |
| 4,525,764 A | 6/1985 | Titus | |
| 4,618,810 A | 10/1986 | Hagerman et al. | |
| 5,341,265 A | 8/1994 | Westrom et al. | |
| 5,568,371 A | 10/1996 | Pitel et al. | |
| 5,574,356 A | 11/1996 | Parker | |
| 5,726,504 A | 3/1998 | Pecukonis et al. | |
| 5,751,530 A | 5/1998 | Pelly et al. | |
| 5,790,356 A | 8/1998 | Bottrell et al. | |
| 5,793,593 A | 8/1998 | Reed et al. | |
| 6,014,386 A | 1/2000 | Abraham | |
| 6,304,089 B1* | 10/2001 | Paulson | G01R 31/026 324/509 |
| 6,369,582 B2 | 4/2002 | Coffeen | |
| 6,518,767 B1 | 2/2003 | Roberts et al. | |
| 6,590,397 B2 | 7/2003 | Roberts | |
| 6,836,416 B2 | 12/2004 | Ishihara et al. | |
| 7,050,279 B2 | 5/2006 | Nojima | |
| 7,834,573 B2 | 11/2010 | Lindsey et al. | |
| 8,115,358 B1 | 2/2012 | Rakov | |
| 9,270,104 B2* | 2/2016 | Inagaki | H02H 3/16 |
| 9,337,762 B1 | 5/2016 | Gibbs et al. | |
| 9,714,974 B2* | 7/2017 | Ha | G01R 31/026 |
| 2002/0141216 A1 | 10/2002 | Ishihara et al. | |
| 2003/0098671 A1 | 5/2003 | Hochgraf | |
| 2003/0197989 A1 | 10/2003 | Nojima | |
| 2006/0012931 A1 | 1/2006 | Engel et al. | |
| 2007/0201170 A1 | 8/2007 | Hooper | |
| 2008/0018274 A1 | 1/2008 | Mori et al. | |
| 2009/0231769 A1 | 9/2009 | Fischer et al. | |
| 2010/0188240 A1 | 7/2010 | Wells | |
| 2010/0295692 A1 | 11/2010 | Bjorn | |
| 2011/0153244 A1 | 6/2011 | Rocha Alves, Jr. et al. | |
| 2012/0081824 A1 | 4/2012 | Narendra et al. | |
| 2012/0140365 A1 | 6/2012 | Labuschagne | |
| 2012/0217919 A1 | 8/2012 | Tang et al. | |
| 2013/0063842 A1 | 3/2013 | Kataoka | |
| 2013/0249213 A1 | 9/2013 | Oesterheld et al. | |
| 2013/0317768 A1 | 11/2013 | Yang et al. | |
| 2016/0149390 A1 | 5/2016 | Donolo | |
| 2016/0181786 A1 | 6/2016 | Ali | |
| 2016/0202306 A1 | 7/2016 | Ha et al. | |
| 2017/0093298 A1 | 3/2017 | Simms et al. | |
| 2017/0149366 A1 | 5/2017 | Gibbs et al. | |

FOREIGN PATENT DOCUMENTS

| | | |
|---|---|---|
| EP | 3054304 A1 | 8/2016 |
| JP | H08331750 A | 12/1996 |
| KR | 10-2003-0040862 A | 5/2003 |
| WO | 2015050323 A1 | 4/2015 |

OTHER PUBLICATIONS

International Written Opinion, PCT/US14/17678 dated Jun. 9, 2014.
International Preliminary Report on Patentability, PCT/US14/17678 dated Jun. 6, 2016.
European Search Report, 14882846.0-1806 / 3108556 PCT/US2014017678, dated Jan. 4, 2018.
Supplementary European Search Report, 14882846.0-1806 / 3108556 PCT/US2014017678, dated Sep. 20, 2017.
Chinese Office Action, 201480076102.X, dated Apr. 13, 2018.
Japanese Office Action, 2016-553595, dated Feb. 5, 2018.
Russian Office Action, 2016137011, dated Nov. 29, 2017.
Demiray, et al., "Comparison of the Efficiency of Dynamic Phasor Models Derived from ABC to DQ0 Reference Frame in Power System Dynamic Simulations" 7th IEE Conference on Advances in Power System Control, Operation and Management, 2006, pp. 1-8.
Horak, et al., "A Practical Guide for Detecting Single-Phasing on a Three-Phase Power System" Western Protective Relay Conference, Oct. 2002, pp. 1-55.
Johnson, et al., "Effect of Transformer Connection and Construction on Single Phasing Detection" 66th Annual Conference for Protective Relay Engineers, Apr. 8, 2013.
Kontarcek, et al., "Predictive Current Method for Single Open-phase Fault Detection in Permanent Magnet Synchronous Machine" 13th International Symposium Topical Problems in the Filed of Electrical and Power Engineering [and] Doctoral School of Energy and Geotechnology II, Pamu, Estonia, 2013.
Mirafzal, et al., "Condition Monitoring of Squirrel-Cage Induction Motors Fe by PWM-based Drives Using a Parameter Estimation Approach" Power System Technology, 2004, PowerCon2004, 2004 International Conference on Nov. 21-24, 2004, pp. 1579-1587, vol. 2.
Norouzi, et al., "Open Phase Conditions in Transformers Analysis and Protection Algorithm" Annual Minnesota Power Systems Conference, Nov. 5-7, 2014, pp. 1-14.
English Translation of Office Action dated Jun. 21, 2019 in Korean Patent Application No. 10-2016-7022774.

* cited by examiner

METHOD FOR DETECTING AN OPEN-PHASE CONDITION OF A TRANSFORMER

The present application is a continuation of co-pending U.S. Ser. No. 15/117,987, filed Aug. 10, 2016, which is a national stage application of International Application No. PCT/US2014/017678, filed Feb. 21, 2014, which applications are incorporated herein by reference.

Recent power delivery system failures have highlighted the need to detect open-phase conditions that can occur in such systems. Particularly, a method is needed to detect such conditions with respect to the response of system auxiliary transformers during open-phase conditions, in order to enable system protection.

In one event, an auxiliary component tripped due to a bus under-voltage. The cause of the event was the failure of the C-phase insulator stack for the system auxiliary transformer revenue-metering transformer. Part of the insulator stack fell to the ground, resulting in a simultaneous unbalanced condition: C phase opened-C phase-to-ground faults. This condition resulted in a voltage imbalance that cascaded down to the station buses through the system auxiliary transformer. The resulting open-phase condition did not cause any of the transformer protective relays to operate, which allowed the condition to exist for an extended period. Ground fault current, a combination of medium-voltage motor contribution and the magnetic coupling of the three-legged core form transformer design, flowed from the system auxiliary transformers, but the magnitude of the current was approximately 60 A, which is well below the pick-up level of the phase overcurrent relays that protect the transformer.

In another event at the same plant, a 345-kV, under-hung porcelain insulator on the system auxiliary transformer's A-frame structure failed due to a manufacturing defect. The 345-kV line fell to the ground, causing a phase-to-ground fault that tripped the system auxiliary transformer lockout scheme, which caused the 6.9-kV buses to fast-transfer to the unit auxiliary transformer and the emergency safety feature buses to be deenergized and then reenergized by diesel generators.

It is possible to detect open-phase conditions on certain transformers using conventional relaying. However, for other transformers, including those incorporating a high voltage side wye connection, it is difficult to detect the presence of an open phase conductor or conductors on the grid side of the transformer because of high voltage regeneration on the primary and secondary side of the transformer due to magnetic flux in the transformer core. Voltage monitoring, such as conventional voltage relaying will not detect an open conductor condition in these circumstances.

Additionally, transformers under light load and/or zero load conditions with respect to power demand, are problematic for detecting open-phase conditions. Examples of light load and no load transformers are those in stand-by mode, such as auxiliary or startup transformers. Low load and no load conditions are prevalent for most station auxiliary transformers.

There is therefore the need for detecting open-phase conditions that can occur in the transformers of power delivery systems for use in power delivery system protection schemes.

A method is provided for detecting an open-phase condition of a transformer having a grounded-wye high voltage side connection, comprising monitoring current flowing in a neutral connection on the high voltage side of the transformer by voltage relaying or current relaying to identify an open-phase condition signature in a signal capable of characterizing change of current magnitude. The monitoring may be conducted in real time.

Also provided is a method for detecting an open-phase condition of a transformer having a grounded-wye high voltage side connection, comprising injecting a signal onto the neutral connection of the transformer, and, monitoring current flowing in a neutral connection on the high voltage side of the transformer to identify an open-phase condition signature in a signal capable of characterizing change of current magnitude.

Figure 1:
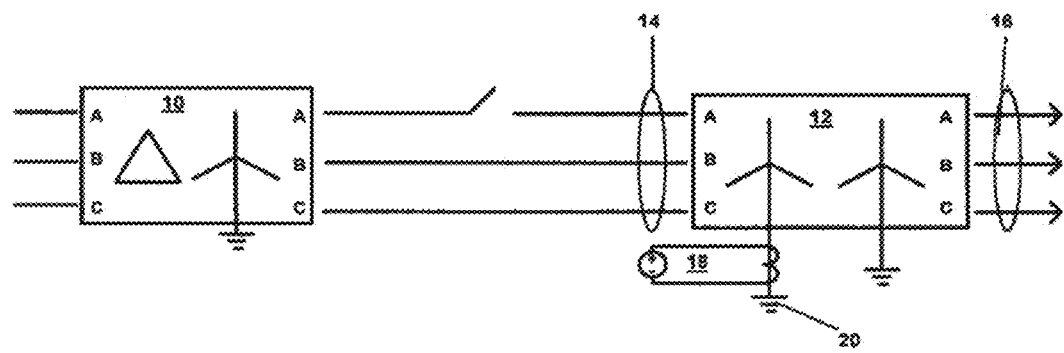
FIG. 1 is a single-line schematic diagram of a system having a transformer, indicating a neutral point for open-phase monitoring.

FIG. 1 shows a schematic diagram indicating a neutral connection for open-phase monitoring. System 10 is physically and electrically coupled to transformer 12. Transformer 12 comprises a high voltage side 14 and a low voltage side 16. Open-phase detection device 18 maintains a neutral electrical contact with neutral connection point 20.

According to certain illustrative embodiments, the transformer may be a station auxiliary transformer or a startup transformer. Also, the transformers may be generator transformers which step the voltage up to transmission level; however, when taking voltage from the transmission system the transformers step down the transmission voltage at transmission substations for industrial, commercial or residential use.

The subject methods are suitable for detection of an open phase condition where the transformer is a wye-delta transformer, a wye-wye three-legged core transformer, a wye-wye three-legged core with buried delta transformer, or a wye-wye shell core with buried delta transformer.

Figure 2:
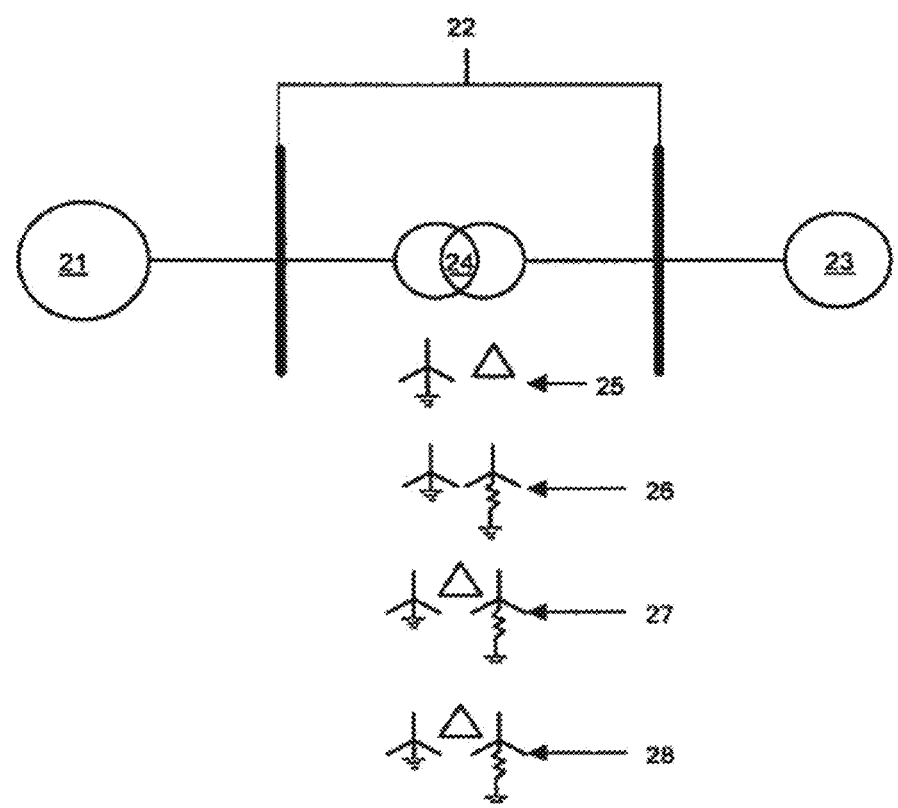
FIG. 2 is a single-line schematic diagram of illustrative systems including various types of transformers suitable for monitoring by the subject method.

FIG. 2 is a single-line schematic diagram of illustrative systems including various types of transformers suitable for monitoring by the subject method. FIG. 2 shows a schematic diagram of a transformer system with various types of transformer configurations. Power source 21 is connected to medium/low voltage network 23 by transformer system 22. Transformer system 22 comprises a transformer core 24 with various wiring configurations. Transformer 24 may comprise a wye-delta winding of any core type 25, a wye-wye with a three-legged core 26, a wye-wye three-legged core with buried delta 27, or a wye-wye shell core with buried delta 28.

In these latter transformers, the third, or tertiary winding is connected in delta, but no terminals are brought out for load connection. Rather, it is buried inside the enclosure. The buried delta connected tertiary coils carry the third harmonic currents, which are all in phase. This prevents the third harmonic currents from entering the external lines, and improves the quality of power in wye connected, four-wire distribution systems.

The detection of an open phase event is an issue with these transformers, because it is difficult to detect the presence of an open conductor(s) on the grid side of a station auxiliary transformer, for example, when the voltage is regenerated on the secondary and primary side of a transformer due to magnetic flux in a transformer core, as is experienced with these transformer types. Also at issue is the detection of open phase conditions of susceptible transformers under lightly loaded and no load (standby) conditions.

In certain embodiments, the present method monitors the neutral current to detect the presence of an open phase condition on the grid side of the transformer, i.e., a neutral current method.

In certain embodiments, the present method uses an injection signal into the neutral connection to actively monitor for an open phase condition on the grid side of the transformer, i.e., a neutral injection method.

In certain embodiments, the method includes voltage monitoring and/or current monitoring on the transformer neutral terminal. The voltage relaying and/or current relaying may be adapted to detect an imbalance in voltage or current created by the event causing the open-phase condition. The open phase conditions may be detected using microprocessor-relays which have digital signal processing capabilities and analog input that accepts the current measurement probe output type, or other data acquisition equipment, known in the industry.

In certain embodiments, the present method includes monitoring transformer network zero-sequence impedance, where the open-phase signature comprises an increase in impedance from hundreds or thousands of Ohms to Mega-Ohms.

The neutral current through a transformer is different when the current loop is under normal, balanced conditions and when the current loop is subject to an open-phase condition. In three phase transformers under normal, balanced conditions, current is split equally between each of the three phases. Typical system operating frequency typically would be 50 Hz or 60 Hz.

Under normal balanced conditions, the transformer network is referred to as a zero sequence network. The balanced zero sequence network is characterized by a low current impedance. The impedance in a zero sequence network may, for example, be from about 300Ω to about 1,000Ω.

Under an open-phase condition, one of the three phases is electrically open, while the other two phases are closed. When one phase is open, the transformer network becomes characterized by a high impedance state, dominated by the transformer's magnetizing impedance properties. The impedance in a transformer network with an open-phase condition may typically be in the MegaOhm range, such as from about 0.5 MΩ to about 3 MΩ.

Further, open-phase conditions may be detected by Fast Fourier Transform (FFT) examination of transformer system harmonics. As a system shifts from a zero sequence network to an open-phase condition, a decrease is exhibited in the third harmonic number, and concurrent increases are exhibited in the first, fifth, and seventh harmonic numbers.

When the injected or neutral current frequency is 60 Hz, the open phase condition signature may comprise at least one of a decrease in a 180 Hz component (third harmonic) of the neutral current, an increase in a 60 Hz component of the neutral current, or an increase in a 300 Hz component (fifth harmonic) of the neutral current.

Harmonics analysis may be performed in the frequency domain using sinusoidal steady-state techniques. The harmonics can be determined either by circuit calculations leading to the device output wave and then conducting Fourier series analysis, or by measurements using a harmonics spectrum analyzer or a power quality analyzer.

Figure 3A:
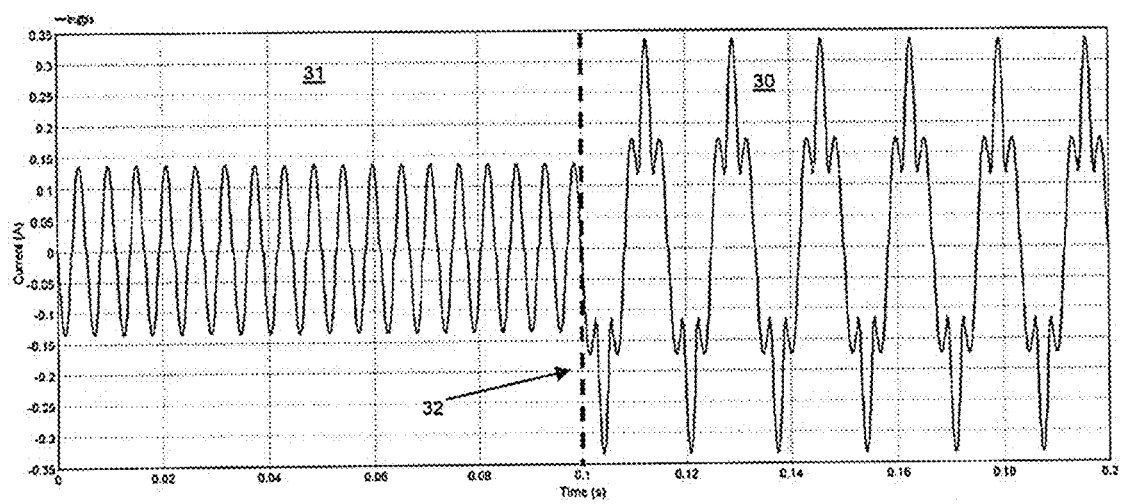
FIG. 3A is a waveform plot depicting neutral current response before and after an open-phase event.

FIG. 3A depicts the simulated behavior of neutral current frequency in a wye-wye transformer with buried delta both before and after an open-phase condition occurs. Before an open-phase event 32 occurs, the FFT frequency of the neutral current harmonics is primarily the third harmonic 31 at 180 Hz. The neutral current frequency 30 is characterized by a change in harmonics during the open-phase condition.

Figure 3B:
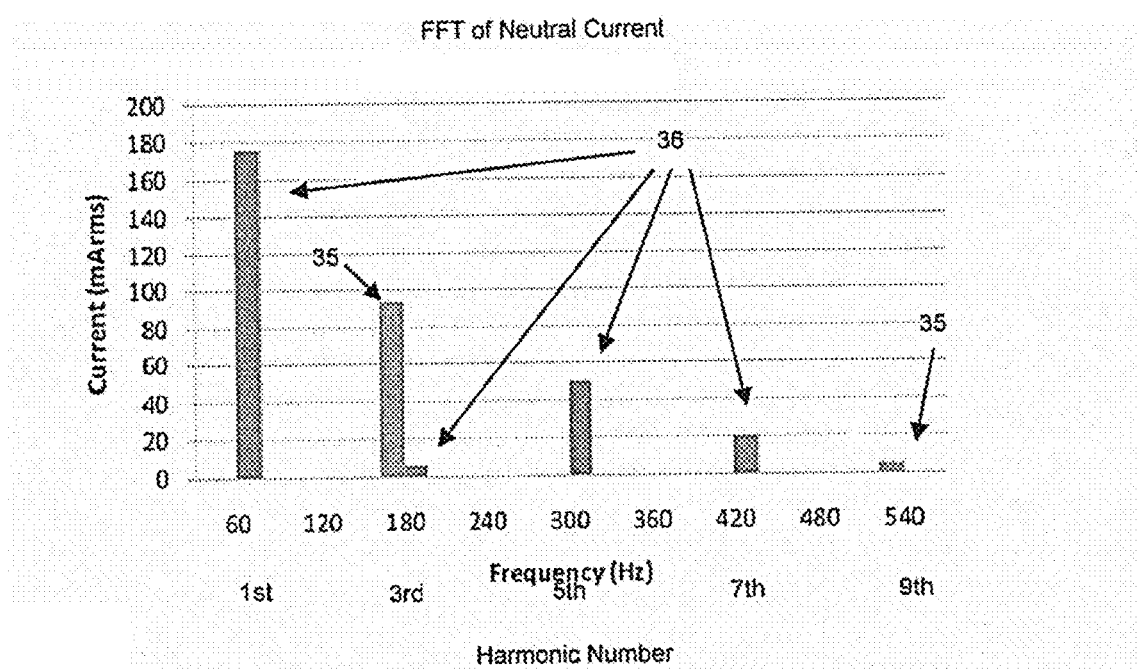
FIG. 3B is a bar graph depicting magnetizing current harmonics before and after an open-phase event.

FIG. 3B depicts the simulated response of the harmonic numbers of the neutral current frequency to the open-phase condition. The FFT harmonic numbers of the neutral current frequency before an open phase condition 35 are characterized by the third and ninth harmonic numbers (180 Hz and 540 Hz). The FFT harmonic numbers during the open phase condition 36 are characterized by an increase in the first, fifth, and seventh harmonic numbers (60 Hz, 300 Hz and 420 Hz), along with a reduction in third harmonic number.

Figure 4A:
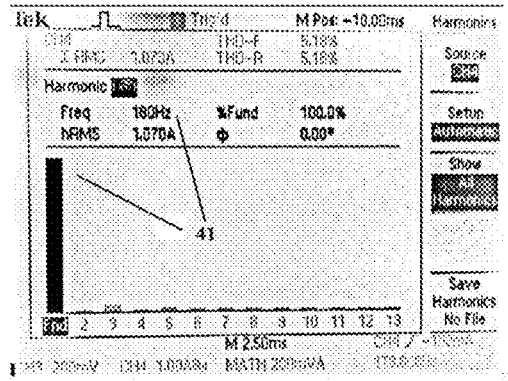
FIG. 4A is a screen shot depicting magnetizing current harmonic measurements before an open-phase event.
Figure 4B:
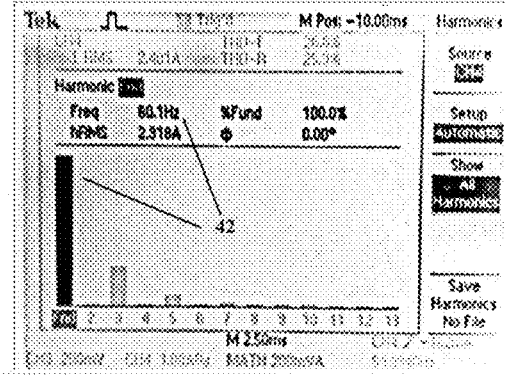
FIG. 4B is a screen shot depicting magnetizing current harmonic measurements after an open-phase event.

FIGS. 4A and 4B are computer screen shots depicting harmonic measurements on a wye-wye 3-legged core (no buried delta) test transformer before and after an open-phase condition. As shown in FIG. 4A, before an open-phase condition occurs, the frequency spectrum of the neutral current is shown to be predominately 180 Hz, the third harmonic 41. As shown in FIG. 4B, during the open-phase condition, the frequency spectrum of the neutral current is shown to be predominately 60 Hz.

In certain embodiments, the method includes a neutral injection signal for monitoring open-phase conditions. An injection current transformer module may be magnetically coupled to a neutral connection of the transformer, wherein the neutral condition of the connection is not altered. For purposes of illustration but not limitation, a signal of about 1 Volt to about 10 V, and from about 10 mA to 100 mA may be injected through the neutral connection. In a zero sequence network, resultant voltages and currents remain near the original input values. In an open-phase condition, the injected signal may drop more than 20 dB.

To provide signal injection, a core is placed around the neutral connection with the amount of turns needed to induce the desired voltage for injection of current into the neutral via magnetic coupling, without breaking the neutral connection. The method injects a small signal, but monitors for a large change in impedance, indicative of an open phase condition.

Figure 5A:
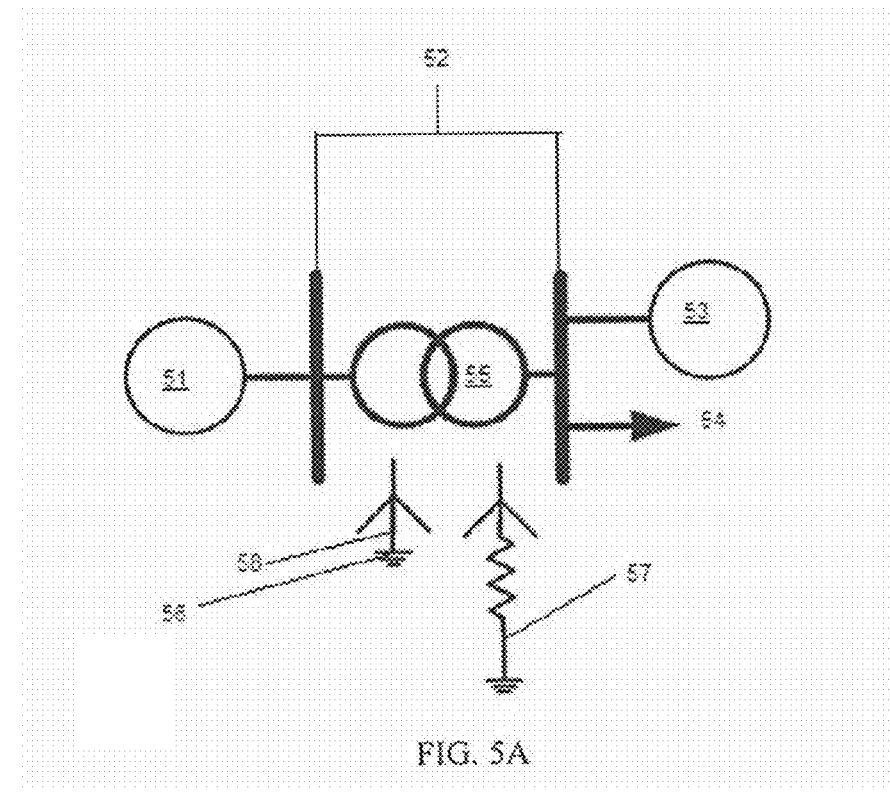
FIG. 5A is a single-line schematic diagram indicating a neutral point for open-phase monitoring of a system transformer.

FIG. 5A depicts a single-line schematic diagram showing a connection for measurement and current injection on a neutral bushing of a wye-wye 3-legged core transformer. Power supply 51 is physically and electrically coupled to transformer 52 with a measurement/injection point 58 on a wye neutral bushing 56, and a secondary neutral connection 57. Transformer 52 is physically and electrically connected to induction motor 53 and resistive load 54.

Figure 5B:
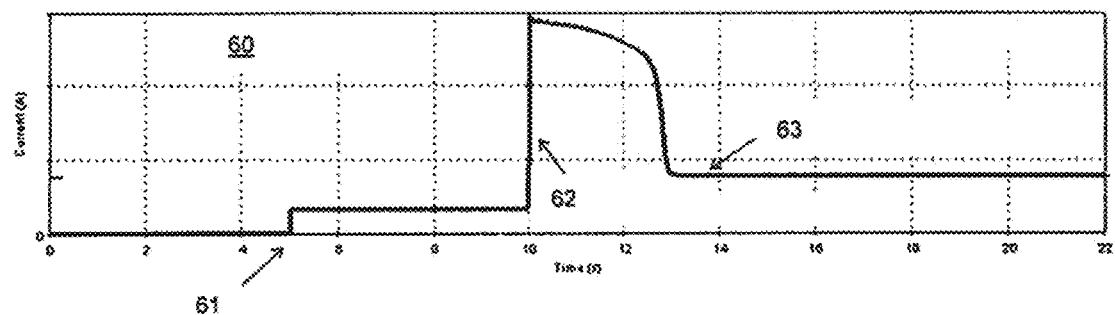
FIG. 5B is a line graph depicting neutral current before and after an open phase event, and a motor start (load) during the open phase condition.

FIG. 5B illustrates the change in the neutral 60 Hz current on the high voltage side created by an open-phase condition. The no electrical load zone 60 is shown before the start up of a 250 hp motor 62. An open-phase condition 61 occurs before the start up of the 250 hp motor 62, at 10 seconds, which is indicated by a small increase in the current (A). In the 250 hp motor operating region 63, a more pronounced increase in the 60 Hz neutral current under load can be detected. After open-phase condition 61 occurs, there is an increase in the 60 Hz component of the neutral current. If no open-phase condition 61 existed, the 60 Hz component of the current in the 250 hp motor operating region 63 would be near zero.

Figure 5C:
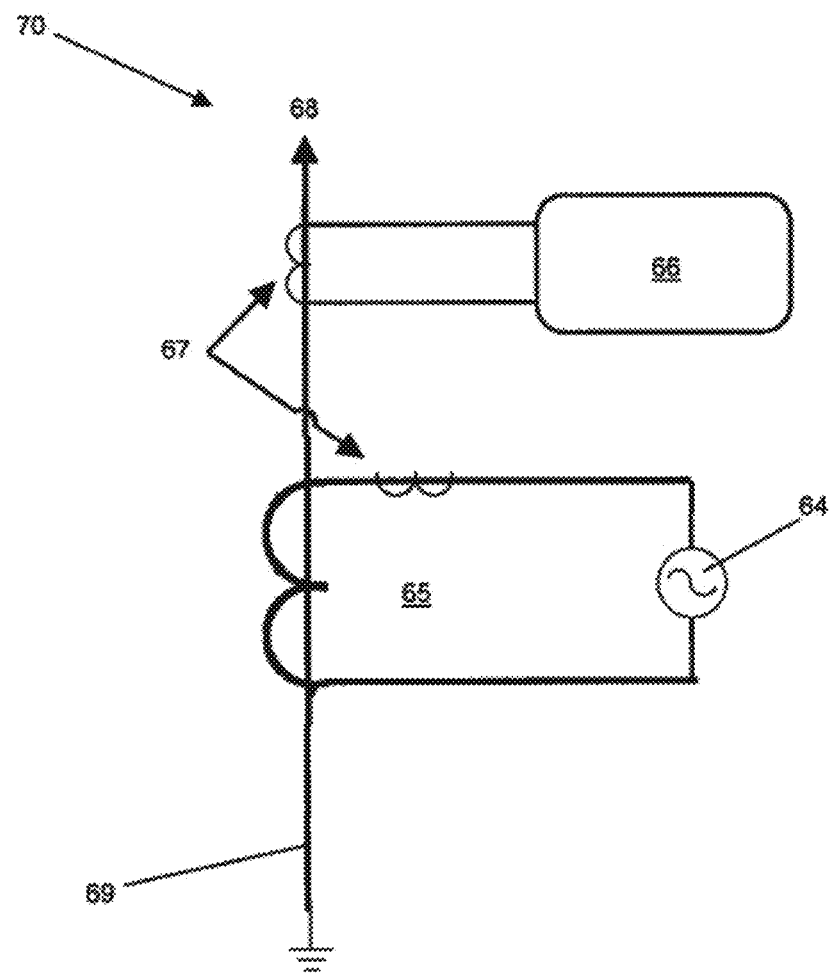
FIG. 5C is a schematic diagram depicting an illustrative neutral injection open-phase detection system.

FIG. 5C illustrates a neutral injection open-phase detection system 70 useful in practicing the subject method, comprising an alternating current (AC) source (whose frequency is different than the power system frequency) connected to a current transformer along with a current measurement probe 67 and electronic controller 66. The injection current transformer 65 may be located in such a manner so as to magnetically couple the injection signal source 64 to a conductor 69 connected to the transformer neutral connection 68 of the wye-connected windings for which an open phase condition may be detected. The current measurement probe 67 may measure current in either the transformer neutral connection 68 or in the injection current transformer 65 winding. This neutral current measurement probe 67 may be connected to an electronic controller 66.

The system detects an open phase condition in the three-phase transformer by monitoring the transformer neutral current, as described herein. Under normal conditions, base levels of injection current and harmonics thereof, are established. When an open phase condition occurs on the wye-connected transformer windings, the electrical impedance of the current path increases, as seen by the injection signal source 64. This increase in electrical impedance results in a decrease in the injection source current level, which is detected by the electronic controller 66. Coincidentally with the decrease in injection source current, an increase in power frequency current occurs in the transformer neutral connection 68 as a result of phase current imbalance caused by the open phase condition.

In certain embodiments, along with the increase in power frequency current in the transformer neutral, changes in harmonics of the power frequency current may also occur when an open phase condition occurs. The power frequency current, along with the harmonic components of the power frequency current, may also be monitored and may be used to detect an open phase condition. Therefore, the neutral injection open phase detection system may utilize three measurements to detect an open phase condition on the wye-connected windings of a three-phase transformer: 1) change in the injection source current level in the transformer neutral connection, 2) change in the power frequency current level in the transformer neutral connection, and 3) change in the levels of harmonics of the power frequency current in the transformer neutral connection, in particular the third and fifth harmonics of the power frequency current.

Figure 6:
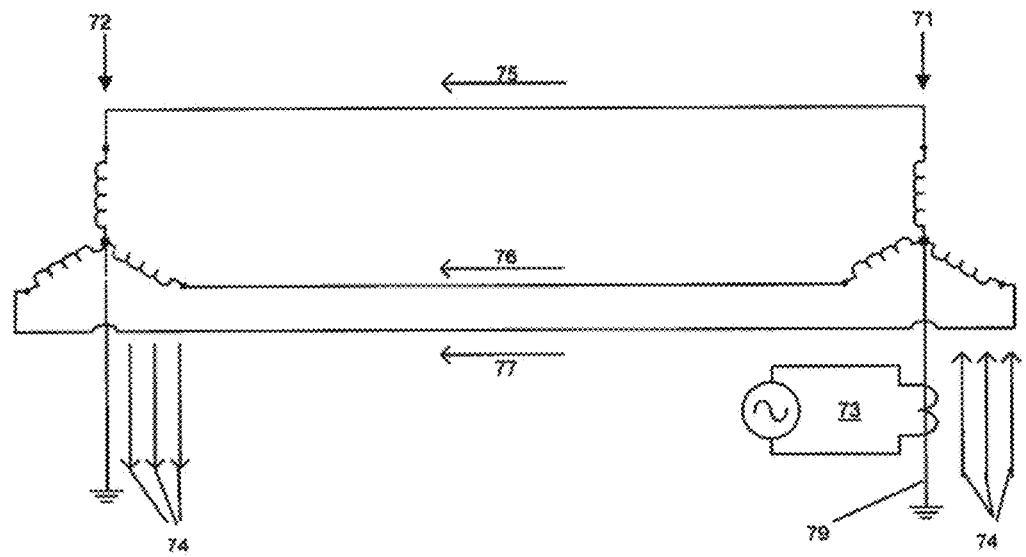
FIG. 6 is a schematic of a monitored transformer under normal operating conditions.

FIG. 6 depicts a monitored transformer, such as any type of transformer depicted in FIG. 2, operating in a low impedance zero sequence mode, with signal injection according to the subject method. The transformer comprises a high voltage side primary winding 71 and a source transformer secondary winding 72. An injection source 73 is magnetically coupled to a neutral bushing 79 of the primary winding 71, and induces a current 74 to be injected into the primary. The injected current 74 flows in the zero-sequence path of the three intact phases 75, 76, and 77, flowing through source transformer secondary winding 72 and out of the winding. Under this zero sequence mode, impedance is relatively low and the current path is simple due to all three phases remaining closed or intact.

Figure 7:
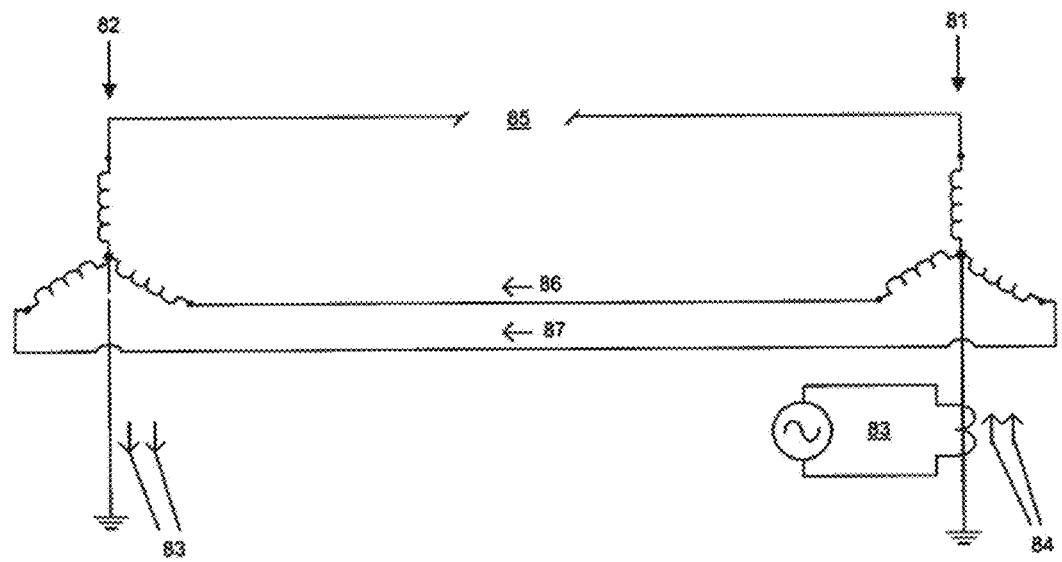
FIG. 7 is a schematic of a monitored transformer operating after undergoing an open-phase condition.

FIG. 7 depicts the same monitored transformer, but under high impedance open-phase conditions, with current injection according to the subject method. The transformer comprises a high voltage side primary winding 81 and a source transformer secondary winding 82. An injection source 83 is magnetically coupled to the primary winding 81, and induces a current 84 to be injected into the primary. The injected current 84 experiences high impedance due to open-phase condition 85, but may still flow through closed phases 86 and 87. While impeded in phases 86 and 87, current 84 may still flow out of the secondary winding.

Compared to FIG. 6, the injected signal current 84 is greatly reduced by the magnetizing impedance generated due to the open-phase condition 85 in FIG. 7. The impedance change is largely due to the network changing from a zero-sequence network dominated by the relatively low zero-impedance network of the transformer to a high-impedance state dominated by the transformer's magnetizing impedance, due to the introduction of an open-phase condition.

Figure 8A:
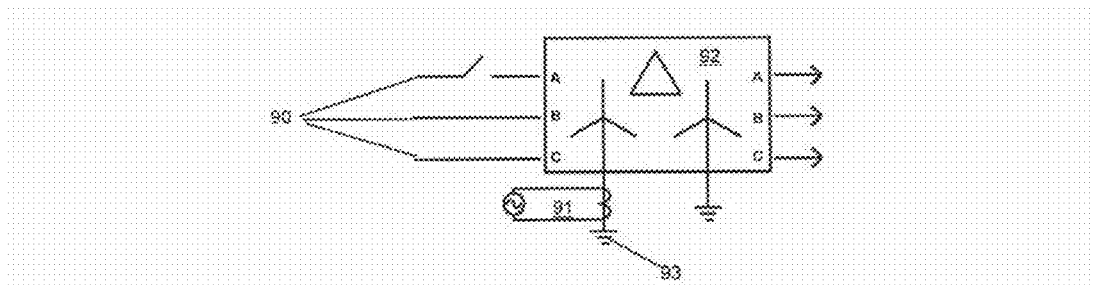
FIG. 8A and FIG. 8B are single-line diagrams depicting illustrative transformer configurations subjected to laboratory testing.

FIG. 8A depicts an embodiment of the current injection monitoring method. A wye-wye core with buried delta transformer 92 is electrically connected with a 208 V, three-phase electrical power supply 90. An injection source 91 is magnetically coupled to a neutral bushing 93 in order to monitor the transformer 92 for open-phase conditions. Conventional voltage detection methods can not detect open-phase conditions in transformers with this configuration.

Figure 8B:
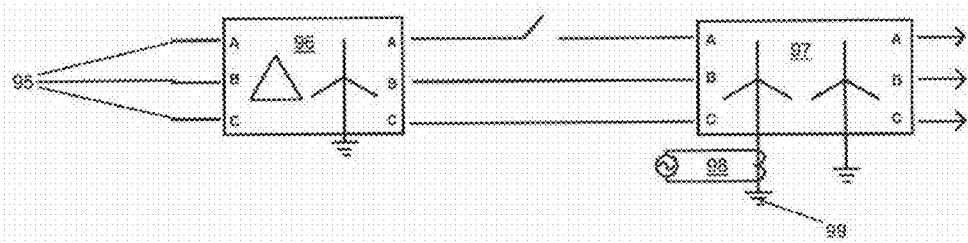

FIG. 8B depicts an embodiment of the current injection monitoring method. A delta-wye transformer 96 is physically and electrically connected in series with a wye-wye three-legged core transformer 97, to a 208 V, three-phase electrical power supply 95. An injection source 98 is electrically connected with a neutral bushing 99 in order to monitor the system for open-phase conditions. Conventional voltage detection methods can not detect open-phase conditions in transformer systems with this configuration.

Figure 9A:
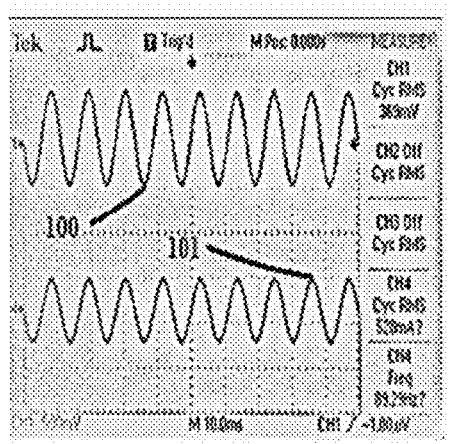
FIG. 9A is a screen shot depicting an injection source signal and primary neutral current without an open phase condition.
Figure 9B:
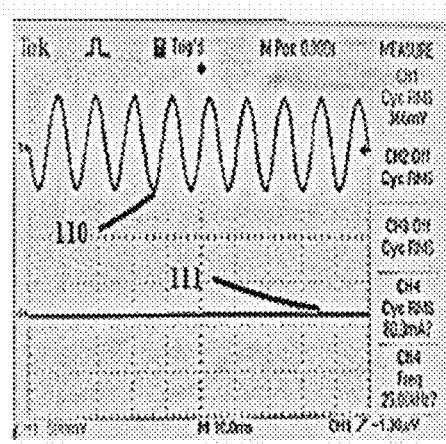
FIG. 9B is a screen shot depicting an injection source signal and primary neutral current with an open phase condition.

FIG. 9A is a screen shot depicting an injection source signal and primary neutral current without an open phase condition. FIG. 9B is a screen shot depicting an injection source signal and primary neutral current with an open phase condition. Where a low impedance zero sequence network exists, injection voltage 100 and injection current 101 both exhibit sinusoidal wave behavior. Where an open-phase condition exists, injection voltage signal 110 maintains sinusoidal wave behavior, but injection current signal 11 has reduced to a detectable amount. The injection current 101 in a zero sequence network was measured at about 530 mA, and the injection current 111 in an open-phase condition was measured at only 80 mA. The drop in observable current is due to the low impedance zero-sequence network transformation into a high impedance state, dominated by the magnetizing impedance of the transformer.

Neutral current or signal injection therefore enables the detection of an open phase condition in those transformer types where conventional voltage or phase current relaying is ineffective.

As shown in the test results, which confirm modeling results, the injection source current decreases significantly due to the change in circuit impedance. This change in injection source current can be monitored through the neutral connection, to detect an open phase condition. There is a detectable change in the neutral current when an open phase condition occurs. Additionally, the 180-Hz component of the neutral current decreases and the 60-Hz and 300-Hz components increase when the open phase occurs.

The neutral injection method is particularly useful for low and no-load transformer situations. In certain embodiments, combine the neutral detection method and the neutral injection method can be combined to provide a robust detection system.

In certain embodiments, the method further comprises introducing an adjustable time delay (in an associated alarm apparatus or circuit breaker) to avoid nuisance alarming or tripping due to voltage sags unrelated to an open-phase event. The method may include a time-current coordination to issue an alarm/trip signal to indicate the presence of the open phase condition.

Figure 10A:
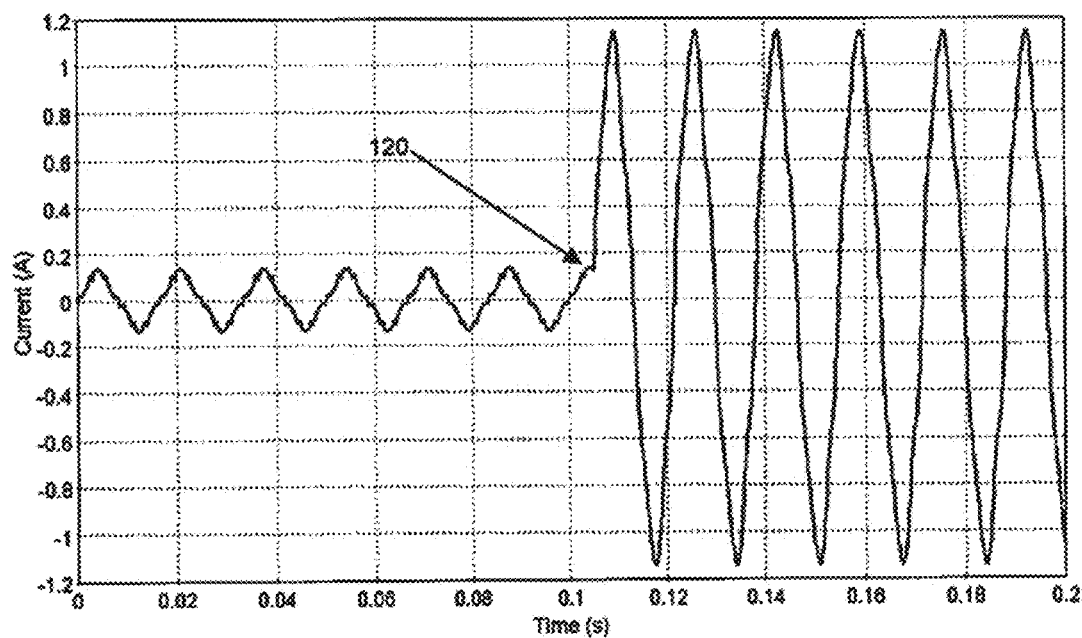
FIG. 10A is a graph showing amplitude of neutral current over time during onset of an open-phase condition.

FIG. 10A depicts the simulated behavior of neutral current frequency in a wye-wye 3-legged core with a buried delta transformer both before and after an open-phase condition occurs. The amplitude of the neutral current wave changed by a magnitude of about 6 after open-phase condition 120 occurred.

Figure 10B:
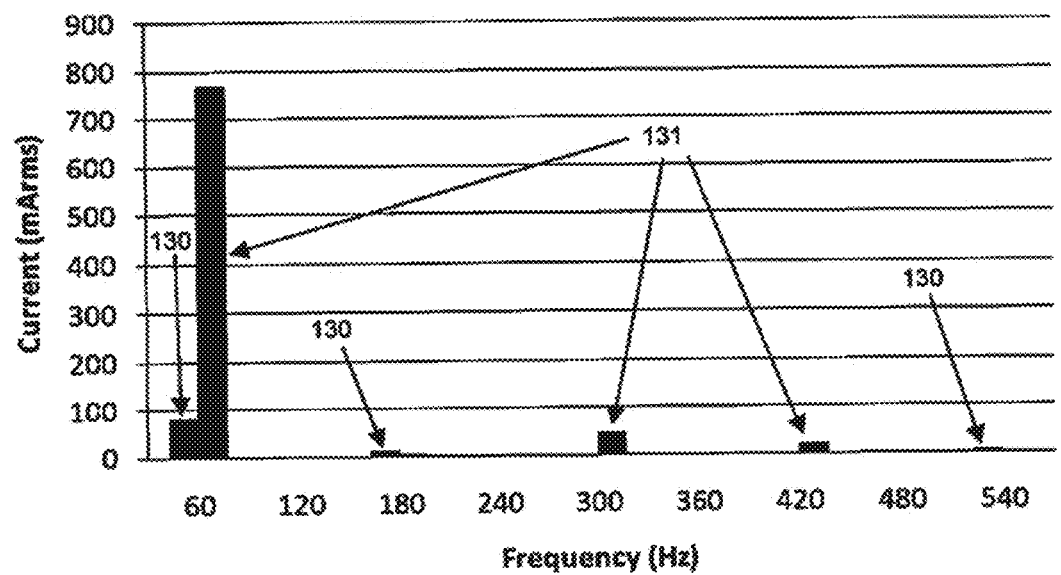
FIG. 10B is a graph showing neutral current versus frequency before and after an open-phase condition.

FIG. 10B depicts the simulated response of the FFT harmonic numbers (components) of the neutral current frequency to the open-phase condition. The components of the neutral FFT current frequency before an open phase condition 130 are characterized by the 60 Hz, 180 Hz, and 540 Hz frequencies; or the first, third, and ninth harmonic numbers, respectively. The components during the open phase condition 131 are characterized by an increase in the 60 Hz, 300 Hz and 420 Hz frequencies (first, fifth, and seventh harmonic numbers), and a decrease in the 180 Hz and 540 Hz frequencies (third and ninth harmonic numbers).

When the transformer was subjected to a 100 kW load, the neutral current was identifiable above network noise. When no load is applied, network noise may mask the 60 Hz component of the neutral current, which may be difficult to detect. When a 100 kW load is applied to the transformer, the harmonics of the neutral current become easier to determine, even without signal injection. In FIG. 10B, under a 100 kW load, the 60 Hz component of the neutral current was identified before an open-phase condition 130 and greatly increased during the open-phase condition 131.

Injection of a neutral signal is needed if the 60 Hz component of the neutral current is too low, and is masked by noise. If the neutral current is over the noise floor, such as when a large enough load is present, then one can detect the increase in the 60 Hz component during an open-phase condition.

Also provided is a system for detecting an open-phase condition of a transformer having a grounded-wye high voltage side connection, comprising an injection signal source in electrical communication with an injection current transformer that is magnetically coupled to a neutral connection of the transformer having a grounded-wye high voltage side connection, a current measurement probe configured for measuring current in the neutral connection or in a winding of the injection current transformer, and an electronic controller in communication with the current measurement probe.

In certain embodiments, the neutral injection open-phase detection system may include the following non-limiting and non-exhaustive list of components: an injection current transformer with a 600:5 ratio and C400 classification:a current measurement probe with 1000 mV/A sensitivity; an electronic controller; and an injection signal source. The electronic controller may comprise any microprocessor based controller with digital signal processing capability and at least one analog input which accepts current measurement probe output; and comprises at least one relay or transistor output for alarm and tripping functions. The injection signal source may be a single- or three-phase variable frequency motor drive. The output voltage of the variable frequency motor drive should not exceed the voltage classification of the injection current transformer.

When an open-phase event or condition is detected, the electronic controller may send a signal via the relay or transistor output to a conventional alarm to alert the system operator, or may trip a system circuit breaker to compensate for the open-phase condition.

In certain embodiments, the neutral injection open-phase detection system electronic controller is capable of digital signal processing.

In certain embodiments, the neutral injection open-phase detection system electronic controller comprises at least one analog input that accepts output from the current measurement probe, and at least one relay or transistor output capable of initiating alarm or tripping functions.

In certain embodiments, the neutral injection open-phase detection system injection signal source comprises a single-phase or three-phase variable frequency motor drive, wherein an output voltage of the variable frequency motor drive does not exceed the voltage classification of the injection current transformer.

Although the embodiments have been described in detail through the above description and the preceding examples, these examples are for the purpose of illustration only and it is understood that variations and modifications can be made by one skilled in the art without departing from the spirit and the scope of the disclosure. It should be understood that the embodiments described above are not only in the alternative, but can be combined.

We claim:

1. A method for detecting an open-phase condition of a transformer in a low load or no-load condition and having a grounded-wye high voltage side connection comprising monitoring current flowing in a neutral connection on the high voltage side of the transformer by voltage relaying or current relaying to identify an open phase condition signature in a signal capable of characterizing change of current magnitude, and effecting an adjustable time delay to filter out signals due to transmission level events unrelated to an open-phase event.

2. The method according to claim 1, wherein the monitoring is in real time.

3. The method according to claim 1, including voltage monitoring and/or current monitoring on a transformer neutral terminal.

4. The method according to claim 3, wherein the voltage relaying and/or current relaying is adapted to detect an imbalance in voltage or current created by the event causing the open-phase condition.

5. The method according to claim 1, including monitoring transformer network zero-sequence impedance, and wherein the open-phase signature comprises an increase in impedance from hundreds or thousands of Ohms to Mega-Ohms.

6. The method according to claim 1, wherein when the injected signal or neutral current frequency is 60 Hz, the open phase condition signature comprises at least one of a decrease in a 180 Hz component of the neutral current, an increase in a 60 Hz component of the neutral current, or an increase in a 300 Hz component of the neutral current.

7. The method according to claim 1, wherein the transformer is a wye-delta transformer, a wye-wye three-legged core transformer, a wye-wye three-legged core with buried delta transformer, or a wye-wye shell core with buried delta transformer.

8. The method according to claim 1, wherein the transformer is a station auxiliary transformer.

9. The method according to claim 1, wherein the transformer is a startup transformer.

10. A method for detecting an open-phase condition of a transformer in a low load or no-load condition and having a grounded-wye high voltage side connection, comprising injecting a signal onto a neutral connection of the transformer, and, monitoring current flowing in a neutral connection on the high voltage side of the transformer to identify an open-phase condition signature in a signal capable of characterizing change of current magnitude, wherein the open phase condition signature comprises a decrease in the injected signal of greater than about 20 dB.

11. The method of claim 2 wherein the open-phase condition is detected by a change in an injection source current level in the neutral connection.

12. The method of claim 2 wherein the open-phase condition is detected by a change in power frequency current level in the neutral connection.

13. The method of claim 2 wherein the open-phase condition is detected by a change in a level of at least one harmonic of power frequency current in the neutral connection.

14. The method of claim 13 wherein the change in the level of at least one harmonic is detected in a third and/or a fifth harmonic of the power frequency current, wherein said at least one harmonic is detected by Fast Fourier Transform.

15. A system for detecting an open-phase condition of a transformer in a low load or no-load condition and having a grounded-wye high voltage side connection, comprising an injection signal source in electrical communication with an injection current transformer that is magnetically coupled to a neutral connection of the transformer having a grounded-wye high voltage side connection, a current measurement probe configured for measuring current in the neutral connection or in a winding of the injection current transformer, and an electronic controller in communication with the current measurement probe, wherein the injection signal source comprises a single- phase or three-phase variable frequency motor drive, and wherein an output voltage of the variable frequency motor drive does not exceed the voltage classification of the injection current transformer.

16. The system of claim 15 wherein the electronic controller is capable of digital signal processing.

17. The system of claim 16 wherein the electronic controller comprises at least one analog input that accepts output from the current measurement probe, and at least one relay or transistor output capable of initiating alarm or tripping functions.

* * * * *

UNITED STATES PATENT AND TRADEMARK OFFICE
CERTIFICATE OF CORRECTION

PATENT NO. : 10,522,998 B2
APPLICATION NO. : 16/111439
DATED : December 31, 2019
INVENTOR(S) : Robert F. Arritt et al.

Page 1 of 1

It is certified that error appears in the above-identified patent and that said Letters Patent is hereby corrected as shown below:

In the Claims

In Claim 11 (Column 9, Line 33), the dependency should read:
"The method of claim 10 wherein the open-phase ..."

In Claim 12 (Column 10, Line 1), the dependency should read:
"The method of claim 10 wherein the open-phase ..."

In Claim 13 (Column 10, Line 4), the dependency should read:
"The method of claim 10 wherein the open-phase ..."

Signed and Sealed this
Twenty-fourth Day of March, 2020

Andrei Iancu
*Director of the United States Patent and Trademark Office*